(12) United States Patent
Ceballos

(10) Patent No.: US 8,947,285 B2
(45) Date of Patent: Feb. 3, 2015

(54) ADC WITH NOISE-SHAPING SAR

(71) Applicant: Infineon Technologies AG, Neubiberg (DE)

(72) Inventor: Jose Luis Ceballos, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/795,347

(22) Filed: Mar. 12, 2013

(65) Prior Publication Data

US 2014/0266827 A1    Sep. 18, 2014

(51) Int. Cl.
*H03M 1/38* (2006.01)
*H03M 1/06* (2006.01)

(52) U.S. Cl.
CPC .................. *H03M 1/0617* (2013.01)
USPC .......................................... 341/161; 341/118

(58) Field of Classification Search
CPC  H03M 1/0617; H03M 1/0612; H03M 1/0634
USPC ......... 341/118, 120, 155, 144, 172, 122, 161, 341/143
See application file for complete search history.

(56) References Cited

U.S. PATENT DOCUMENTS

| | | | | |
|---|---|---|---|---|
| 4,528,551 | A * | 7/1985 | Agrawal et al. | 341/143 |
| 4,651,131 | A * | 3/1987 | Pearce | 341/155 |
| 5,103,229 | A * | 4/1992 | Ribner | 341/143 |
| 6,492,930 | B2 * | 12/2002 | Enriquez | 341/155 |
| 6,507,302 | B2 * | 1/2003 | Sakimura | 341/143 |
| 6,922,161 | B2 * | 7/2005 | Lee | 341/143 |
| 7,136,339 | B2 * | 11/2006 | Kubota et al. | 369/53.29 |
| 7,710,092 | B2 * | 5/2010 | Chapuis et al. | 323/282 |

* cited by examiner

*Primary Examiner* — Peguy Jean Pierre
(74) *Attorney, Agent, or Firm* — SpryIP, LLC

(57) ABSTRACT

Representative implementations of devices and techniques provide analog to digital conversion of analog inputs. A multistage comparator using a feed-forward technique can provide noise shaping of conversion errors. For example, the comparator may feed a conversion error forward from a first stage to a next stage of the multistage comparator.

25 Claims, 6 Drawing Sheets

ADC WITH NOISE-SHAPING SAR

BACKGROUND

Analog-to-digital converters (ADCs) convert time-discrete analog input values to a digital form. A type of ADC, the Σ-Δ modulator, digitizes the analog input values, and then analogizes the digital output signal by means of a digital-to-analog-converter (DAC), feeding the analog value back to at least a subsequent analog input value. Σ-Δ ADCs may be operated at a high frequency. A distribution of the quantization noise, which results from quantization errors, can be achieved by means of a larger spectral range. The quantization noise can then be better eliminated from the digital output signal with the aid of suitable filters, for example.

One form of noise shaping, in the case of Σ-Δ modulators, includes shaping the quantization noise by feeding back the digital output signal of the quantizer (in analog form) to an earlier stage of the ADC. For example, the feedback may return the analog output to the ADC input.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide analog to digital conversion with noise shaping of analog inputs. A multistage comparator is used as a component of a quantizer of the analog-to-digital converter (ADC). The multistage comparator employs a feed-forward design during the conversion process. For example, conversion error may be delayed and combined with the input to a subsequent stage of the comparator.

In various implementations, sample and hold components or circuits may be used to acquire conversion errors, and to make the errors available after a predetermined delay. The sample and hold components may include one or more switched capacitors, for example.

Various implementations and techniques for an analog to digital conversion arrangement are discussed in this disclosure. Techniques and devices are discussed with reference to example analog-to-digital converter (ADC) devices and systems illustrated in the figures. In some cases, successive-approximation ADC (SA-ADC) designs are shown and discussed. However, this is not intended to be limiting, and is for ease of discussion and illustrative convenience. The techniques and devices discussed may be applied to any of various ADC device designs, structures, and the like (e.g., direct-conversion ADC, flash ADC, ramp-compare ADC, integrating ADC (also referred to as dual-slope or multi-slope ADC), counter-ramp ADC, pipeline ADC, sigma-delta ADC, time interleaved ADC, intermediate FM stage ADC, etc.), and remain within the scope of the disclosure.

Implementations are explained in more detail below using a plurality of examples. Although various implementations and examples are discussed here and below, further implementations and examples may be possible by combining the features and elements of individual implementations and examples.

Example ADC Arrangement

Figure 1A:
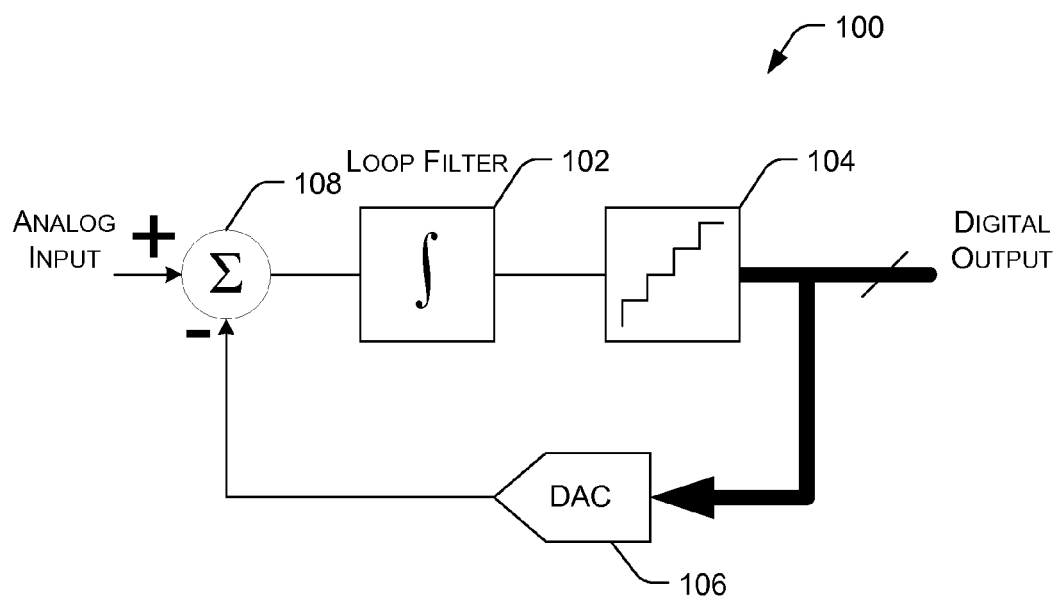
FIG. 1A is a block diagram of an example analog-to-digital converter (ADC) arrangement, wherein the techniques and devices disclosed herein may be applied, according to an implementation.

FIG. 1A is a block diagram of an example analog-to-digital conversion (ADC) arrangement 100, wherein the techniques and devices described herein may be applied. Analog signals ("analog input") are received on the input side, converted by a quantity of ADC components, and digital results ("digital output") are output from the ADC 100.

For the purposes of this disclosure, a digital result may be described as a digital approximation of an analog input. For example, a digital result may include a digital representation that is proportional to the magnitude of the voltage or current of the analog input, at a point in time and/or over a selected duration. The digital representation may be expressed in various ways (e.g., base 2 binary code, binary coded decimal, voltage values, electrical or light pulse attributes, and the like).

As shown in FIG. 1A, an example ADC 100 may include a loop filter 102 comprising one or more interconnected integrators, a quantizer 104, a digital to analog converter (DAC) 106, and an adder 108. In alternate implementations, an example ADC 100 may include fewer, additional, or alternate components.

If included, the loop filter 102 is arranged to receive the analog input signal (and the feedback signal) and integrate their difference to determine a value to be quantized. The integrated signal may include a voltage or current value, for example.

In various implementations, the loop filter 102 may comprise a continuous time (CT) integrator, a switched capacitor (SC) integrator, or the like. In some cases, a CT integrator may have lower power consumption when compared to a SC integrator.

If included, the quantizer 104 receives the integrated analog input signal from the loop filter 102 and determines a digital approximation for the input signal. In various implementations, the output of the quantizer 104 is the digital output of the ADC 100. As shown in FIG. 1A, the digital output of the ADC 100 may have multiple bits, based on the resolution of the quantizer 104. Configurations and/or arrangements for the quantizer 104 are discussed further below.

In one implementation, the quantizer 104 determines a digital approximation for the analog input signal by taking samples of the analog signal at regular intervals, and approximating a digital value for each sample. Further, the process of approximating a digital value for each sample may be according to one or more processes or algorithms, as discussed further below.

In an implementation, the DAC 106 receives the digital output of the quantizer 104, and converts it to an analog form. As shown in FIG. 1A, the analog form of the digital output may be fed back, and combined with the analog input signal (e.g., subtracted).

In one implementation, the DAC 106 may be linearized with a data weighting average (DWA) technique, for example. In other implementations, various other techniques may be used with the DAC 106 to improve the performance of the DAC 106 and/or the ADC 100.

Figure 1B:
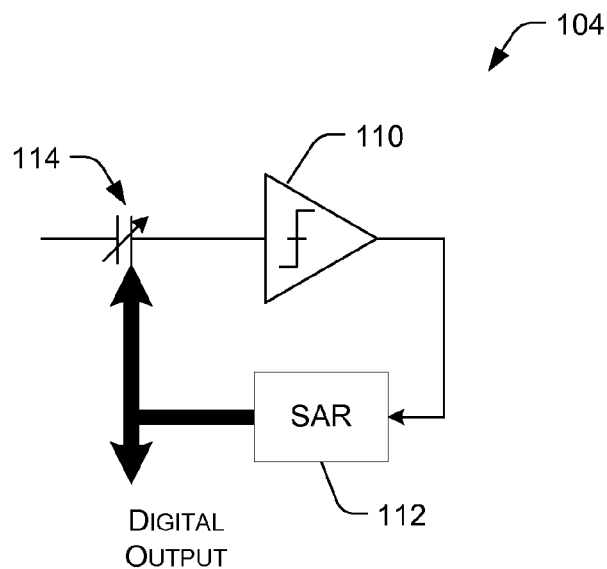
FIG. 1B is a block diagram of an example quantizer of the ADC of FIG. 1A, according to an implementation.

FIG. 1B is a block diagram of an example quantizer 104 of the ADC 100 of FIG. 1A, according to an implementation. In various implementations, the quantizer 104 includes one or more comparators 110 and a successive approximation arrangement, such as the successive approximation register (SAR) 112 of FIG. 1B. Additionally, the quantizer 104 may include one or more sample and hold components (SH) 114, such as a capacitor array, for example.

In such an implementation, the ADC 100 may use a successive approximation (SA) algorithm, or the like, to convert sampled analog values to digital results via a binary or non-binary search. The sample and hold component 114 is charged to a time-discrete value of the analog input signal. The binary search is conducted through some or all possible quantization levels, and eventually converges on a digital result for the conversion. For example, the SAR 112 may be initialized so that the most significant bit (MSB) is equal to a digital 1. This digital code is output as the digital output of the ADC 100. In an implementation, as shown in FIG. 1B, the digital output is also output to the DAC 106, which approximates the digital code to an analog value.

It should be understood that the SAR 112 and the ADC 100 (e.g., a $\Sigma$-$\Delta$ ADC), having the loop filter 102, may each operate as an independent process. Furthermore, it is to be understood that the noise shaping SAR 112 may operate at a faster clock rate than the ADC 100. Therefore, the SAR 112 may require an n+1 faster clock to preform one conversion, where the ADC 100 may require a clock being approximately n+1 times slower.

Resolution of the ADC 100 may be defined based on the minimum voltage level required to cause a change in the output code (e.g., a reset of a bit from 1 to 0 in the SAR 112). For example, the minimum voltage that causes a change in the digital code is the least significant bit (LSB) of the ADC 100. The resolution of the ADC 100 is the LSB voltage. In alternate implementations, other algorithms are used, or variations of the algorithm described are used, to determine the digital output. In various implementations, the SAR 112 may have 3, 4, or 5 bit resolution. In alternate implementations, the SAR 112 may have fewer or greater number of bits of resolution.

In an implementation, the SH component(s) 114 are arranged to receive the integrated analog input signal. In an implementation, the SH component(s) 114 are arranged to output a sample value based on the input analog signal received. For example, the SH component 114 may sample an analog input signal and output the value of the sample to the comparator 110, based on a switch, for example, operating to charge and discharge the variable capacitance of the SH 114.

For instance, in the example shown in FIG. 1B, the SH component 114 is shown comprising a variable capacitance. In various implementations, the SH component 114 also acts as a digital-to-analog converter (DAC) in the SAR process. For example, the SH 114 may receive the digital output of the SAR 112, and convert it to an analog signal, arranged to be input to the comparator 110. In the implementations, the SH 114 may comprise a capacitor array, or the like. In some implementations, the SH 114 may also include one or more switches, buffers, or the like, as discussed further below.

Example Multistage Comparator

Figure 2:
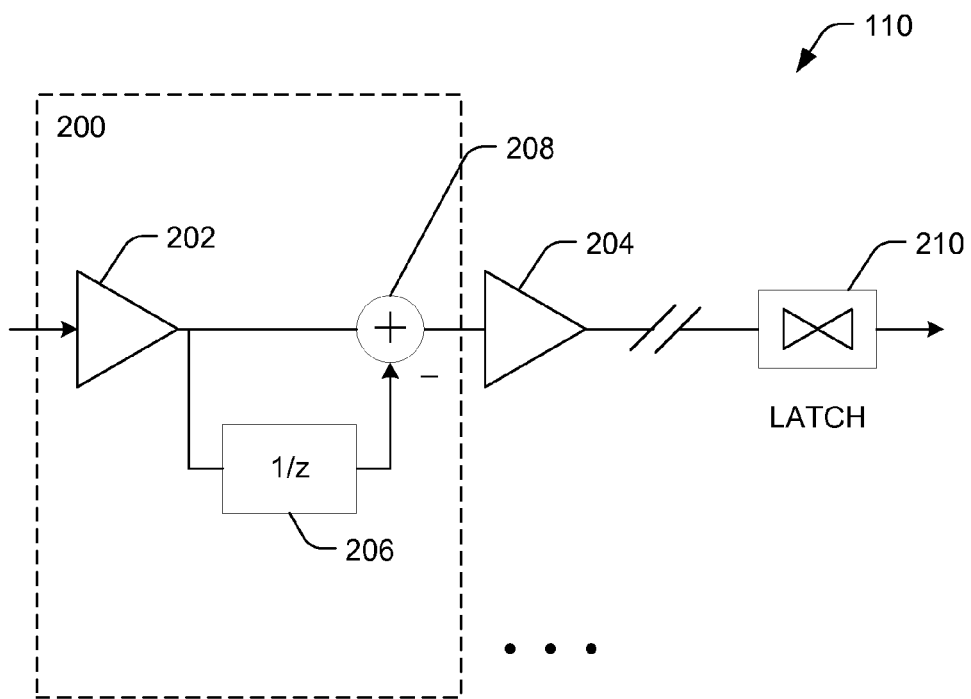
FIG. 2 is a block diagram of an example comparator of the quantizer of FIG. 1B, according to an implementation. The example comparator is shown as having multiple stages, with a feed-forward design.

FIG. 2 is a block diagram of an example comparator 110 of the quantizer 104 of FIG. 1B, according to an implementation. The example comparator 110 is shown as having multiple stages 200 (i.e., two or more stages), with a feed-forward design. In various implementations, any number of stages 200 may be employed, with similar components and functionality to those shown in FIG. 2 at stage 200.

As discussed above, the techniques, components, and devices described herein with respect to the example comparator 110 are not limited to the illustration in FIG. 2, and may be applied to other comparator 110 devices and designs without departing from the scope of the disclosure. In some cases, additional or alternative components may be used to implement the techniques described herein. Further, the components may be arranged and/or combined in various combinations, while resulting in a digital output. It is to be understood that a comparator 110 may be implemented as a stand-alone device or as part of another system (e.g., integrated with other components, systems, etc.).

With the quantizer 104 according to the disclosed example, the quantization error is computed in analog form and fed forward to a subsequent stage 200 input value. This exploits the property that with most ADCs the quantization error is present inside the circuit and can be picked up in analog form. The quantization error is determined and fed forward to at least a subsequent input value for at least a next stage 200.

Referring to FIG. 2, each of the multiple stages 200 is arranged to receive one or more analog signals. In one implementation, one or more SH components 114 (e.g., capacitors, etc.) is arranged to receive the analog input signal and output the analog input signal to a stage 200 according to a predetermined timing.

In an implementation, each stage 200 includes one or more transconductances (202, 204), such as an operational transconductance amplifier (OTA), for example, and a delay component 206. In one implementation, each stage 200 (or alternately, one or more of the stages 200) of the multistage comparator 110 is arranged to produce noise shaping of the quantization error. For example, the quantization noise is shifted from the useable frequency band to another frequency (e.g., a higher frequency) where the noise may be easily filtered, if desired.

In various implementations, the stages 200 are arranged to shift the quantization noise based on the delay component 206 and the feed-forward design. For example, quantization noise, or conversion error, is determined by a differential amplification of the OTA 202, and is received by the delay component 206. The error is delayed a predetermined duration at the delay component 206, and is then combined (e.g., subtracted from) the output of the OTA 202, at a combiner 208 (e.g., analog combiner), to form an input for the next stage 200. This represents the feed-forward design, since an input to a subsequent stage 200 is based on the output of a previous stage 200. In an alternate implementation, the combiner 208 adds the output of the delay component 206 to the output of the OTA 202, or a modified version of the output of the OTA 202, for example.

The result of the feed-forward stages 200 is a shifting (e.g., shaping) of the quantization noise or quantization error to a non-used frequency band. Thus, the final output captured at the latch 210 is a noise-shaped version of the output of the multiple stages 200. This noise-shaped version of the final output has the in-band quantization noise reduced from the output.

Feed-forward of a quantization error to at least a next input value can be equivalent to the feed-forward of at least one quantization error of a previous conversion to a next conversion. Thus, the quantization errors of at least one previous conversion phase are fed forward to an input value, based on a delay of the delay component 206.

In various implementations, additional or alternative components may be used to accomplish the disclosed techniques and arrangements.

Example Implementations

Figure 3:
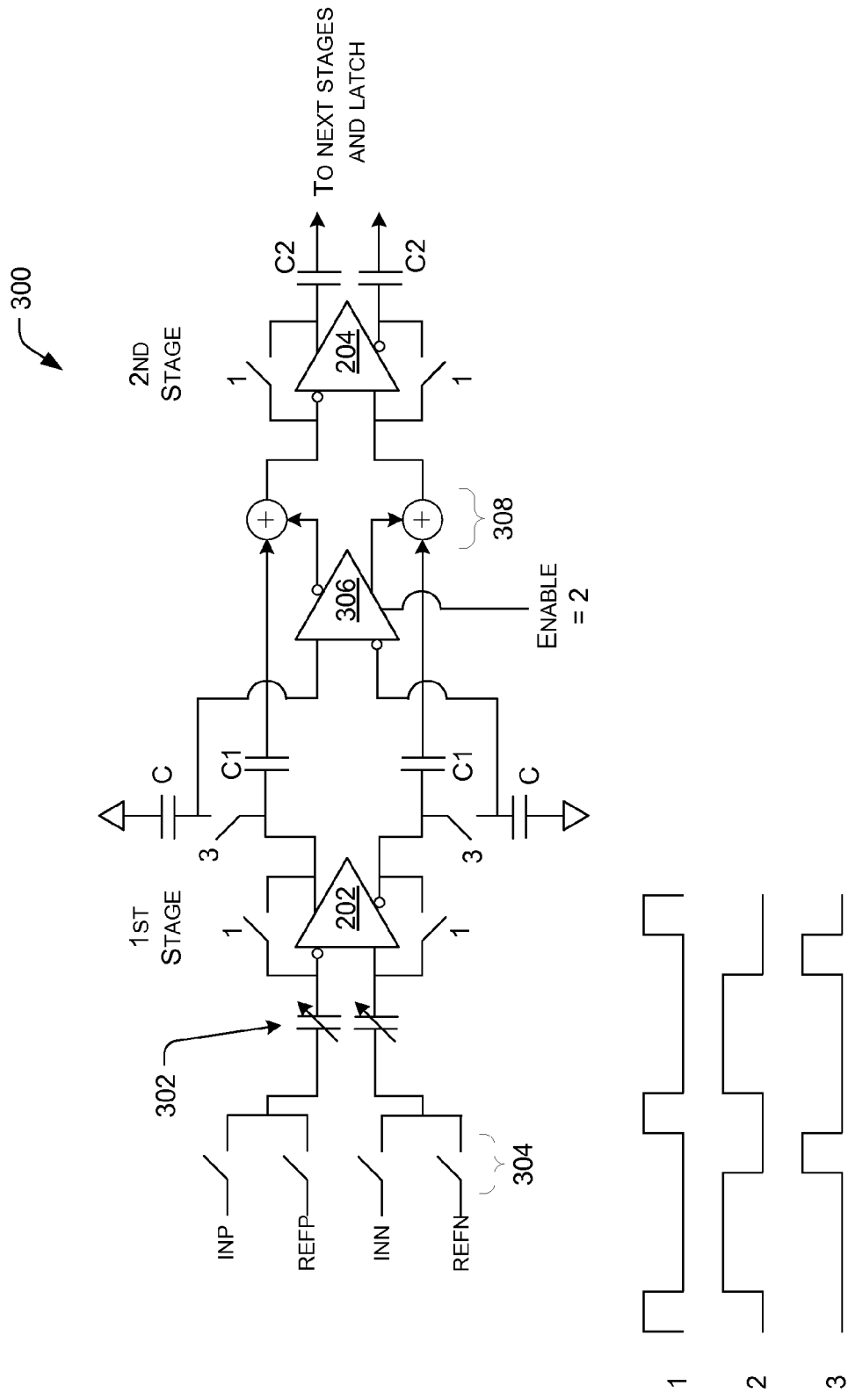
FIG. 3 is a schematic diagram of an example comparator design of the comparator of FIG. 2, according to an implementation. Also shown in FIG. 3 is an example timing diagram for the switches of the comparator design of FIG. 3.

FIG. 3 is a schematic diagram of an example comparator design 300, according to an implementation. For example, the comparator design 300 may be one implementation of the multistage comparator 110 of FIGS. 1B and 2. Also shown in FIG. 3 is an example timing diagram for the switches (1 and 3) and the OTA 306 of the comparator design 300 of FIG. 3. Three control signals, 1, 2, and 3, are shown, with timing given for each. For example, when the control signal 1 is high, the switches marked "1" in FIG. 3 are closed, and when the control signal 1 is low, the switches marked "1" in FIG. 3 are open. This same convention is used for control signal 3, and the associated switches marked "3" in FIG. 3. When the control signal 2 is high, the OTA 306 is enabled (i.e., operational).

In an implementation, the capacitances 302 are charged with either one of the analog input signal or a reference signal, depending on the position of the switches 304. In one example, the differential inputs to the first stage OTA 202 include the analog input signal and a reference signal. The associated signals are transferred throughout the differential paths of the comparator design 300 as shown in FIG. 3, based on the timing control signals (1, 2, and 3).

When the control signal 1 goes high, and the switches marked "1" are closed, the OTAs 202 and 204 are reset. In one implementation, the output of the second stage (or the final stage, in the case of more than two stages) OTA 204 is transferred to the SAR 112 (as shown in FIG. 1B), via the capacitances C2 (after being converted to a digital format via the latch 210). This value becomes the digital output of the ADC 100 after passing through the SAR 112, according to the algorithm(s) or process(es) of the SAR 112.

When the control signal 2 goes high, the control signal 1 goes low, and the switches marked "1" are opened. The OTAs 202 and 204 of the comparator 110 are operational for a full conversion cycle. The OTA 306 is enabled during the conversion cycle, to perform (at least in part) the feed-forward function of the comparator 110. In one example, any previously stored error value (from a previous conversion cycle) has been stored in the SH capacitances "C." This value is "fed forward" and combined with the output of the first stage OTA 202 (as stored in SH capacitances "C1") to form the input of the second stage OTA 204, via OTA 306 and the combiners 308.

When the control signal 3 goes high, the control signal 2 goes low, and the switches marked "3" are closed. The OTA 306 is no longer enabled. However, any quantization error from the first stage OTA 202 from the current conversion cycle (i.e., the conversion cycle just completed) is stored in the SH capacitances "C." This actual error value becomes the "previously stored error value" for a subsequent or "next" conversion cycle. In an implementation, the timing repeats, returning to control signal 1 going high, and control signal 3 going low, as described above.

Figure 4:
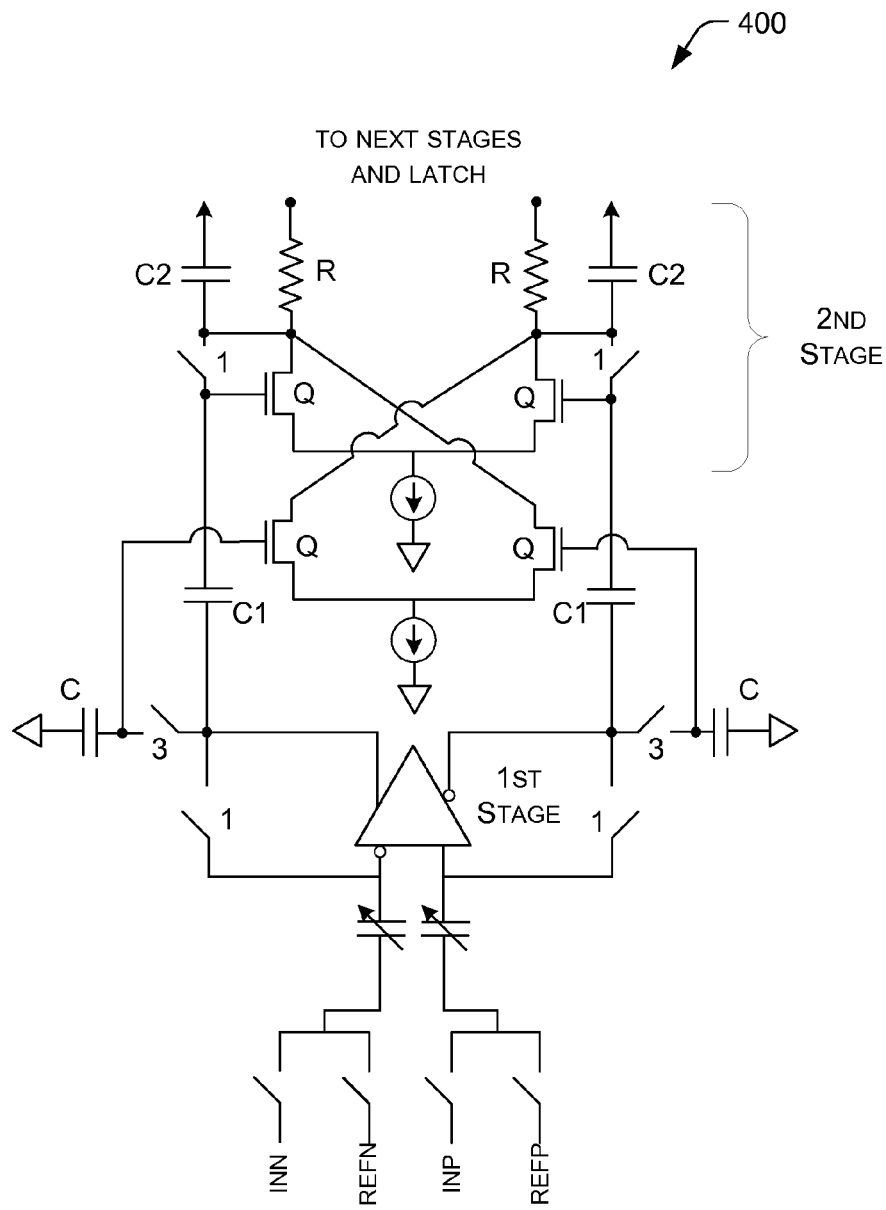
FIG. 4 is a circuit diagram of an example realization of the comparator design of FIG. 3, according to an implementation.

FIG. 4 is a circuit diagram of an example realization 400 of the comparator design 300 of FIG. 3, according to an implementation. In one example, as shown in FIG. 4, one or more of the OTAs (202, 204, and 306) may be implemented using a set of four (or alternately more or less) transistors "Q," such as metal-oxide-semiconductor field-effect transistors (MOSFETs), or similar devices. In various implementations, the transistors Q are maintained in the linear range of their operation during conversion cycles of the comparator 110.

In alternate implementations, switches 1 and 3 may be implemented with fast switching transistors, such as MOSFETS, or the like. Further, capacitances C, C1, and C2 may be selected, and implemented, with devices having desired sample and hold properties, such as low leakage, fast charging, and the like. Resistances R may be implemented with resistors, semiconductor devices, and the like, having desired impedance properties for outputting the final conversion value to the SAR 112.

Figure 5:
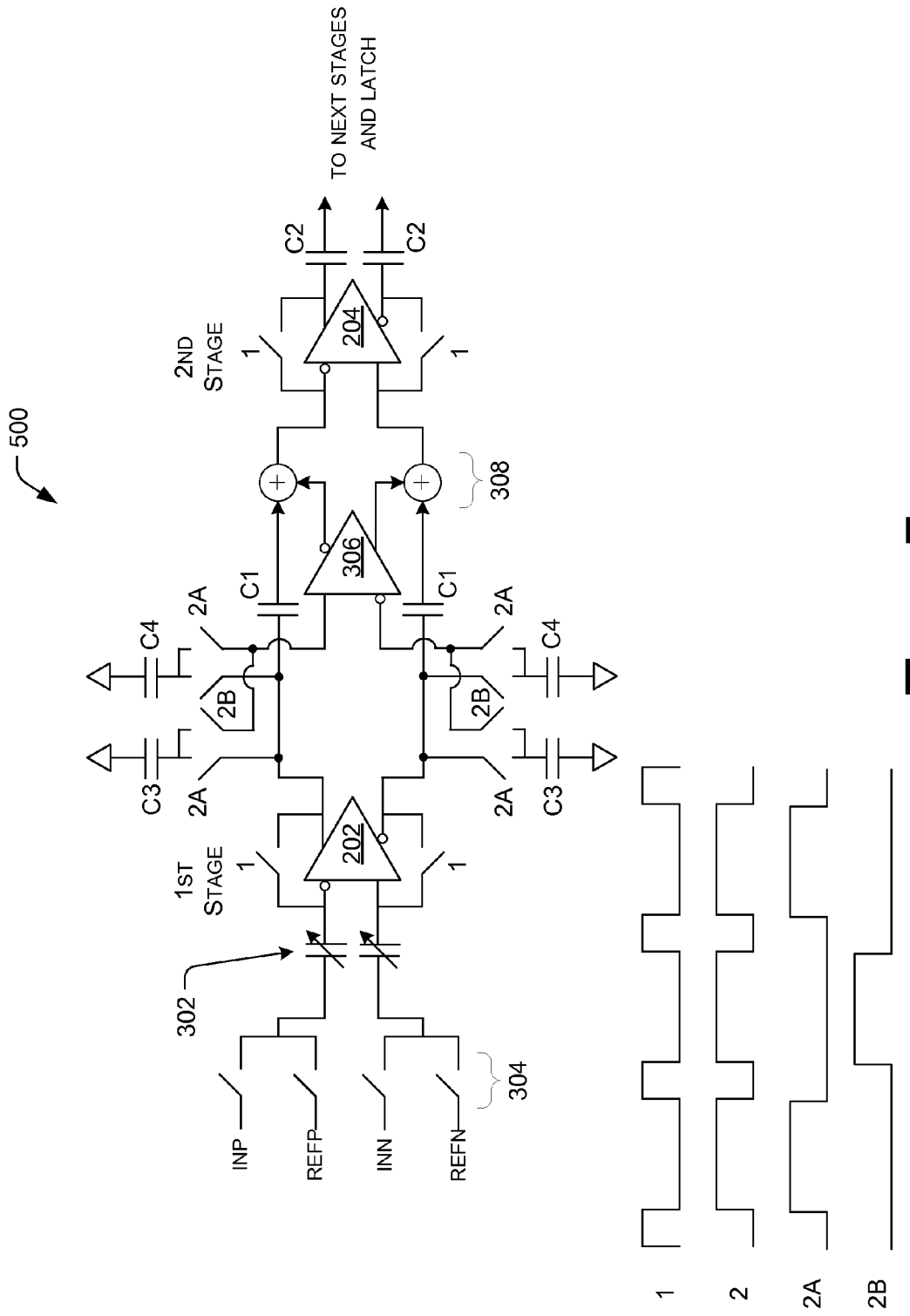
FIG. 5 is a schematic diagram of another example comparator design of the comparator of FIG. 2, according to another implementation. Also shown in FIG. 5 is an example timing diagram for the switches of the comparator design of FIG. 5.

FIG. 5 is a schematic diagram of another example comparator design 500 of the comparator 110 of FIGS. 1B and 2, according to another implementation. Also shown in FIG. 5 is another example timing diagram for the switches (1, 2A, and 2B) of the comparator design 500 of FIG. 5. The comparator design 500 operates similarly to the comparator design 300, except that the comparator design 500 uses two sets of capacitances (C3 and C4) with a two-phase clock in place of the single set of capacitances (C) and the three-phase clock of the comparator design 300.

Two control signals (1 and 2) are used (2A and 2B are shown for convenience, and represent the alternating cycles of control signal 2 with respect to switches 2A and 2B), with timing given for each. For example, when the control signal 1 is high, the switches marked "1" in FIG. 5 are closed, and when the control signal 1 is low, the switches marked "1" in FIG. 5 are open. This same convention is used for control signal 2, and the associated switches marked "2A" and "2B" in FIG. 5, except that the switches marked "2A" and "2B" alternate being closed when control signal 2 goes high. Further, when one switch (2A or 2B) is closed, the other switch (2A or 2B) is open. This is illustrated by the virtual control signals 2A and 2B.

In an implementation, the capacitances 302 are charged with either one of the analog input signal or a reference signal, depending on the position of the switches 304. In one example, the differential inputs to the first stage OTA 202 include the analog input signal and a reference signal. The associated signals are transferred throughout the differential paths of the comparator design 500 as shown in FIG. 5, based on the timing control signals (1 and 2).

When the control signal 1 goes high, and the switches marked "1" are closed, the OTAs 202 and 204 are reset. In one implementation, the output of the second stage (or the final stage, in implementations having more than two stages) OTA 204 is transferred to the SAR 112 (as shown in FIG. 1B), via the capacitances C2 (after being converted to a digital format via the latch 210). This value becomes the digital output of the ADC 100 after passing through the SAR 112, according to the algorithm(s) or process(es) of the SAR 112.

When the control signal 2 goes high, the control signal 1 goes low, opening the switches marked "1," and the switches marked "2A" are closed. The OTAs 202 and 204 of the comparator 110 are operational for a full conversion cycle. The OTA 306 is enabled during the conversion cycle, to perform (at least in part) the feed-forward function of the comparator 110. In one example, any previously stored error value (from a previous conversion cycle) has been stored in the SH capacitances "C4." This value is "fed forward" and combined with the output of the first stage OTA 202 (as stored in SH capacitances "C1") to form the input of the second stage OTA 204, via OTA 306 and the combiners 308. Further, the quantization error from the first stage OTA 202 from the current conversion cycle is stored in the SH capacitances "C3." This actual error value becomes the "previously stored error value" for a subsequent or "next" conversion cycle.

When the control signal 1 goes high again, closing the switches marked "1," the control signal 2 goes low, and the switches marked "2A" are opened. The OTAs 202 and 204 are reset, and the output of the second stage (or final stage) OTA 204 is transferred to the SAR 112, via the capacitances C2.

When the control signal 2 goes high again, the control signal 1 goes low, opening the switches marked "1," and the switches marked "2B" are closed. The OTAs 202 and 204 of the comparator 110 are again operational for a full conversion cycle. The OTA 306 is enabled during the conversion cycle, to perform (at least in part) the feed-forward function of the comparator 110. In an example, the previously stored error value (from the previous conversion cycle) that is stored in the SH capacitances "C3" is "fed forward" and combined with the output of the first stage OTA 202 (as stored in SH capacitances "C1") to form the input of the second stage OTA 204, via OTA 306 and the combiners 308. Further, the quantization error from the first stage OTA 202 from the current conversion cycle is stored in the SH capacitances "C4." This actual error value becomes the "previously stored error value" for the next conversion cycle. Accordingly, the process repeats as described above, with control signal 1 going high again.

In various implementations, the multistage comparator design 500 may be realized or implemented in like manner as that shown in FIG. 4, with appropriate differences (e.g., double sets of SH capacitances C3 and C4, etc.).

Based on the feed-forward comparator designs 300 and 500, as shown in FIGS. 3 and 5, when applied to the ADC arrangement 100, the noise shaping of these designs is of a second order. This may reduce the quantization noise appearing in the useful frequency spectral range to a greater degree than with a first order design, for example. If the loop filter 102 is of a higher order, then the overall noise shaping order is increased by one, due to the SAR 112 noise shaping characteristics.

Representative Process

Figure 6:
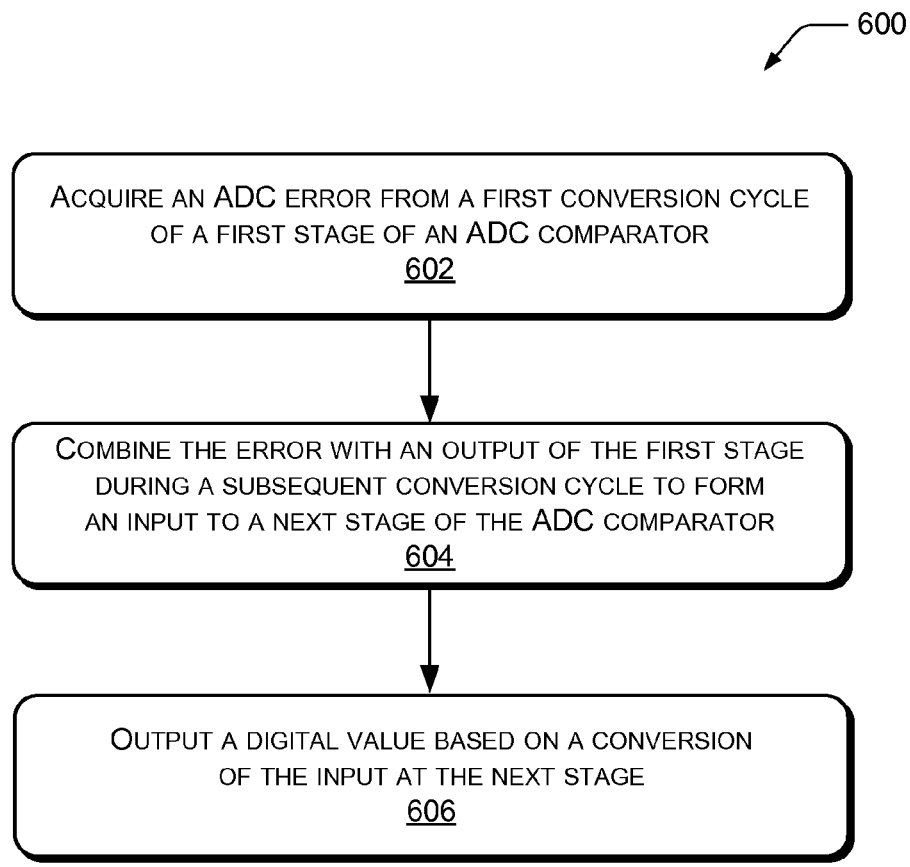
FIG. 6 is a flow diagram illustrating an example process for providing analog to digital conversion including noise shaping, according to an implementation.

FIG. 6 is a flow diagram illustrating an example process 600 for providing analog to digital conversion of time-discrete analog inputs, according to an implementation. The process 600 describes using a multistage comparator (such as comparator 110) with a feed-forward technique at an analog-to-digital converter (ADC) (such as ADC 100). For example, the comparator may feed a conversion error forward from a first stage to a next stage. In various implementations, the multistage comparator provides noise shaping to the ADC, based on the feed-forward technique. In an implementation, the comparator may be included with a successive approximation device (such as SAR 112, for example) as a quantizer for the ADC. The process 600 is described with reference to FIGS. 1-5.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

In an implementation, the multistage comparator includes two or more conversion stages. At block 602, the process includes acquiring an analog to digital conversion error from a first conversion cycle of a first stage of the analog-to-digital converter (ADC) comparator (such as comparator 110, for example). In various implementations, the error may be acquired from the first conversion cycle of the first stage with a sample and hold circuit (such as SH 114, for example). For example, in an implementation, the sample and hold circuit includes one or more capacitors (such as capacitances C, C3, and C4, for example).

At block 604, the process includes combining the error with an output of the first stage during a subsequent conversion cycle to form an input to a next stage of the ADC comparator. For example, the error may be combined with the output of the first stage using a combiner (such as combiner 208 or 308, for example). In an implementation, the error is "fed forward" to the combiner and/or the next stage.

In one implementation, the process includes delaying combining the error with the output of the first stage a predetermined duration, to form the input to the next stage. For example, sample and hold components may act as a shift register, or the like, for the error, delaying the combining of the error with the output for a duration of one or more conversion cycles.

In an implementation, the process includes noise-shaping the error by feeding the error forward to the next stage. For example, in an implementation the process includes at least partially shifting quantization noise from a useful spectral range to a lesser-used frequency spectral range. In an example, the noise is shifted to a higher frequency range. In a further example, the noise is filtered at the higher frequency range.

In an implementation, the process includes acquiring an output conversion error from the conversion at the next stage. For example, the next stage may be the final stage, and the output conversion error may be based on a conversion at the final stage. As discussed above, the output conversion error may be shifted in frequency (i.e., noise-shaped).

At block 606, the process includes outputting a digital output value based on a conversion of the input at the next stage (or final stage). For example, the digital approximation of the ADC can be produced based on an output of the next (or final) stage of the comparator. In an example, the output is received by a successive approximation component, which converts the output to the digital approximation based on an algorithm or technique.

In alternate implementations, other techniques may be included in the process 600 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An apparatus, comprising:
a first stage arranged to receive an analog input and to perform a first conversion based on the analog input;
a delay component arranged to receive and delay a conversion error of the first conversion, based on a predetermined delay;
a combiner arranged to receive an output of the first stage and to combine the output with the error to form an input of a next stage; and
a next stage arranged to receive the output of the first stage combined with the error, and to perform a conversion based on the output of the first stage and the error, an output of the next stage resulting in a digital approximation of the analog input.

2. The apparatus of claim 1, further comprising one or more additional next stages arranged to receive the output of the first stage combined with the error, and to perform one or more next conversions based on the output of the first stage and the error.

3. The apparatus of claim 1, further comprising one or more sample and hold components arranged to acquire the conversion error of the first conversion and to output the error based on the predetermined delay.

4. The apparatus of claim 3, wherein one or more of the sample and hold components includes one or more capacitances.

5. The apparatus of claim 1, wherein the predetermined delay is based on one or more conversion cycles.

6. The apparatus of claim 1, wherein the first stage and/or the final stage include one or more operational transconductance amplifiers (OTAs).

7. The apparatus of claim 6, wherein at least one of the one or more OTAs comprises a quantity of metal-oxide-semiconductor field-effect transistors (MOSFETs).

8. The apparatus of claim 1, wherein the apparatus comprises at least a portion of a multistage comparator of an analog-to-digital converter (ADC).

9. The apparatus of claim 8, wherein the apparatus comprises at least a portion of a quantizer of the ADC.

10. A system, comprising:
a quantizer arranged to convert an analog input signal to a digital approximation, the quantizer including:
a multistage comparator arranged to acquire an analog to digital conversion error at a first conversion cycle of a first stage and to feed the error forward, combining the error with an output of the first stage during a subsequent conversion cycle to form an input to a next stage, the digital approximation based on the subsequent conversion cycle at the next stage; and
a digital to analog converter arranged to convert the digital approximation to an analog value.

11. The system of claim 10, further comprising a summation component arranged to receive the analog input signal, combine it with an output of the digital to analog converter to form a combined input signal, and output the combined input signal to the quantizer.

12. The system of claim 10, further comprising an integrator arranged to integrate the analog input signal and to output the integrated analog input signal to the quantizer.

13. The system of claim 10, the quantizer further comprising a successive approximation component arranged to provide the digital approximation based on an output of the next stage of the comparator.

14. The system of claim 10, wherein the multistage comparator provides noise shaping of the digital conversion error based on feeding the error forward from the first stage to the next stage.

15. The system of claim 10, wherein the multistage comparator includes a plurality of operational transconductance amplifiers (OTAs).

16. The system of claim 10, wherein the multistage comparator includes a plurality of sample and hold components.

17. The system of claim 16, wherein one or more of the plurality of sample and hold components includes a capacitance.

18. The system of claim 10, wherein the multistage comparator is arranged to delay the digital conversion error at least a predetermined duration prior to combining the error with the output of the first stage, based on the subsequent conversion cycle.

19. A method, comprising:
acquiring an analog to digital conversion error from a first conversion cycle of a first stage of an analog to digital converter (ADC) comparator;
combining the error with an output of the first stage during a subsequent conversion cycle to form an input to a next stage of the ADC comparator; and
outputting a digital output value based on a conversion of the input at the next stage.

20. The method of claim 19, further comprising acquiring the error from the first conversion cycle of the first stage with a sample and hold circuit.

21. The method of claim 20, wherein the sample and hold circuit includes one or more capacitors.

22. The method of claim 19, further comprising delaying combining the error with the output of the first stage a predetermined duration, to form the input to the next stage.

23. The method of claim 19, further comprising noise-shaping the error by feeding the error forward to the next stage.

24. The method of claim 23, further comprising at least partially shifting quantization noise from a useful spectral range to a lesser-used frequency spectral range.

25. The method of claim 19, further comprising acquiring an output conversion error from the conversion at the next stage.

* * * * *